United States Patent
Nishimura et al.

(10) Patent No.: US 10,331,028 B2
(45) Date of Patent: Jun. 25, 2019

(54) IMPRINTING APPARATUS, RECORDING MEDIUM, AND IMPRINTING METHOD

(71) Applicant: Toshiba Memory Corporation, Minato-ku (JP)

(72) Inventors: Takahito Nishimura, Kuwana (JP); Jun Iijima, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 398 days.

(21) Appl. No.: 15/011,915

(22) Filed: Feb. 1, 2016

(65) Prior Publication Data

US 2017/0136683 A1 May 18, 2017

Related U.S. Application Data

(60) Provisional application No. 62/254,328, filed on Nov. 12, 2015.

(51) Int. Cl.
*G03F 7/00* (2006.01)

(52) U.S. Cl.
CPC .................. *G03F 7/0002* (2013.01)

(58) Field of Classification Search
CPC ............. G03F 7/0002; G03F 7/70483; G03F 7/70616; G03F 7/7065; G03F 1/84; B29C 59/002; B29C 64/106; B29C 64/112; B29C 64/30; B29C 64/393; B29C 64/386; G01N 21/9501; G01N 21/9503; G01N 21/9505; G01N 2223/6116; G01N 2291/2697
USPC .................. 264/293; 356/237.1; 382/141
See application file for complete search history.

(56) References Cited

U.S. PATENT DOCUMENTS

| 7,360,851 B1* | 4/2008 | Snyder ..................... B41J 3/407 347/2 |
| 8,394,282 B2 | 3/2013 | Panga et al. |
| 8,485,624 B2 | 7/2013 | Mikami et al. |
| 8,768,665 B2 | 7/2014 | Veeraraghavan et al. |
| 2006/0009943 A1* | 1/2006 | Keck ....................... G06Q 10/06 702/122 |
| 2010/0012622 A1* | 1/2010 | Panga ..................... B82Y 10/00 216/52 |
| 2011/0144943 A1 | 6/2011 | Veeraraghavan et al. |
| 2012/0131056 A1* | 5/2012 | Matsuoka ............. G03F 7/0002 707/776 |
| 2013/0251906 A1 | 9/2013 | Takimoto |
| 2014/0353527 A1* | 12/2014 | MacNaughton ........ H01J 37/28 250/492.22 |

(Continued)

FOREIGN PATENT DOCUMENTS

| JP | 2006-167650 | 6/2006 |
| JP | 2013222728 A | * 10/2013 |

(Continued)

OTHER PUBLICATIONS

Machine Translation of JP-2013222728-A (Year: 2013).*

*Primary Examiner* — Matthew J Daniels
*Assistant Examiner* — Leith S Shafi
(74) *Attorney, Agent, or Firm* — Oblon, McClelland, Maier & Neustadt, L.L.P.

(57) ABSTRACT

According to one embodiment, an imprinting apparatus is provided. The imprinting apparatus includes a controller that controls a resist drop position on a wafer to be imprinted with a pattern, using a first resist drop recipe corresponding to a first topography of the wafer.

9 Claims, 13 Drawing Sheets

(56) References Cited

U.S. PATENT DOCUMENTS

2015/0234287 A1\* 8/2015 Tanaka .................. G03F 7/7035
                                                                            355/27
2016/0163033 A1\* 6/2016 Vukkadala .............. G06T 7/001
                                                                           382/145

FOREIGN PATENT DOCUMENTS

| JP | 5349588 | 11/2013 |
|---|---|---|
| JP | 5404570 | 2/2014 |
| JP | 5694219 | 4/2015 |
| JP | 5758406 | 8/2015 |

\* cited by examiner

IMPRINTING APPARATUS, RECORDING MEDIUM, AND IMPRINTING METHOD

CROSS-REFERENCE TO RELATED APPLICATIONS

This application is based upon and claims the benefit of priority from U.S. Provisional Application No. 62/251,328, filed on Nov. 12, 2015; the entire content of which are incorporated herein by reference.

FIELD

Embodiments described herein relate generally to an imprinting apparatus, a recording medium, and an imprinting method.

BACKGROUND

An imprinting technique is a pattern forming technique which transfers a template having an uneven transfer pattern formed therein to a resist on a wafer at the same magnification. In an imprinting process, in some cases, an overlay error occurs due to shearing force applied to the template and the wafer.

Therefore, in the imprinting process, it is desirable to reduce the shearing force applied to the template and the wafer to reduce the overlay error.

DETAILED DESCRIPTION

According to this embodiment, an imprinting apparatus provided. The imprinting apparatus includes a controller that controls a resist drop position on a wafer to be imprinted with a pattern, using a first resist drop recipe corresponding to a first topography of the wafer.

Hereinafter, an imprinting apparatus, a recording medium, and an imprinting method according to embodiments will be described in detail with reference to the accompanying drawings. The invention is not limited by these embodiments.

First Embodiment

Figure 1:
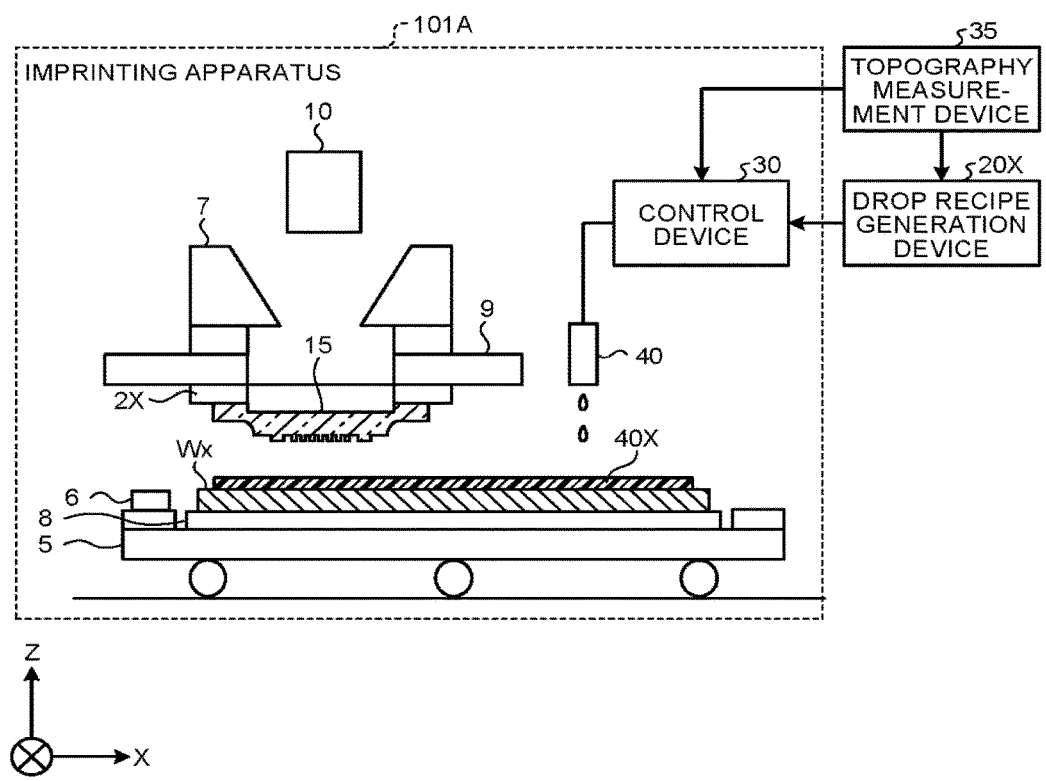
FIG. 1 is a diagram illustrating the structure of an imprinting apparatus according to a first embodiment.

FIG. 1 is a diagram illustrating the structure of an imprinting apparatus according to a first embodiment. FIG. 1 illustrates the structure of an imprinting apparatus 101A as viewed from the Y-axis direction. In this embodiment, a wafer Wx is placed on an X-Y plane and the upper surface of the wafer Wx is perpendicular to the Z-axis.

The imprinting apparatus 101A is an apparatus which performs an imprinting process such as nano-imprinting lithography (NIL). The imprinting apparatus 101A transfers a template pattern (transfer pattern) of a template 15 to a resist 40X which is arranged on a substrate (semiconductor substrate) to be transferred, such as the wafer Wx, at the same magnification.

The template 15 is an original plate which formed using a plate member having a rectangular main surface and the template pattern is an uneven pattern such as a circuit pattern. For example, an electron beam drawing device is used to form a resist pattern and the resist pattern is etched by plasma etching to form the template pattern. The template 15 is also called a mold, a stamper, or a die. The imprinting apparatus 101A forms a resist pattern (uneven pattern) on the substantially entire surface of the wafer Wx using a step and repeat method.

The imprinting apparatus 101A according to this embodiment selects drop recipe information corresponding to a topography, which is a step portion in a shot of the wafer Wx, from the drop recipe information items (drop recipe files) which are prepared in advance. The drop recipe information is information about the drop conditions (drop position) of the resist 40X onto the wafer Wx. In the drop recipe information, the topography and the drop recipe are associated with each other. The imprinting apparatus 101A drops the resist 40X onto the wafer Wx, using the selected drop recipe information.

Hereinafter, the wafer of which the topography is measured when the drop recipe information is prepared is referred to as a wafer Wy (not illustrated). In some cases, the topography of the wafer Wx to be imprinted with a pattern is referred to as a topography Tx. In some cases, the topography of the wafer Wy is referred to as a topography Ty.

The topographies Tx and Ty are step portions (geometries) in the wafers Wx and Wy, respectively. In this embodiment, it is assumed that the topographies Tx and Ty indicate topographies in each imprinting shot. In other words, in this embodiment, the topographies Tx and Ty are step portions in an imprinting shot. Therefore, the topography Tx is a step portion in a shot of the wafer Wx and the topography Ty is a step portion in a shot of the wafer Wy.

The topographies Tx and Ty can be represented according to parameters, such as a shape, flatness (a PV value which will be described below), a step portion, and nanotopography. These parameters are low-frequency components of the wafers Wx and Wy or the main surface and the rear surface of an imprinting shot. The parameters are defined in a space wavelength range of about 0.2 mm to 20 mm and have a characteristic portion with a height of several nanometers (nm). In other words, the topography is an uneven portion on the surface of the wafer having a space wavelength component of about 0.2 mm to 20 mm and is a non-planar deviation (in-plane flatness) in a fixed quality area (FQA). The topographies Tx and Ty include dips, bumps, and waves on the surfaces of the wafers Wx and Wy. For example, the peak of the height of valley of the dip, bump, or wave changes from several nanometers to several hundreds of nanometers. In this embodiment, the topographies Tx and Ty are non-planar deviations in a certain space wavelength range and the FQA in a shot.

The imprinting apparatus 101A includes an original plate stage 2X, a sample stage 5, a reference mark 6, an alignment sensor 7, a substrate chuck 8, a stage base 9, and a light source 10. In addition, the imprinting apparatus 101A according to this embodiment includes a control device 30 and a dropping device 40.

The wafer 13x is placed on the sample stage 5 and the sample stage 5 is moved in the plane (horizontal plane) parallel to the loaded wafer Wx. The sample stage 5 carries and moves the wafer Wx which has the resist 40X as a transfer material applied onto the substantially entire surface thereof except for the edge to the lower side of the template 15. In addition, when an imprinting process is performed on the wafer Wx, the sample stage 5 sequentially moves each shot position on the wafer Wx to the lower side of the template 15.

The substrate chuck 8 is provided on the sample stage 5. The substrate chuck 8 fixes the wafer Wx at a certain position on the sample stage 5. In addition, the reference mark 6 is provided on the sample stage 5. The reference mark 6 is a mark for detecting the position of the sample stage 5 and is used for alignment when the wafer Wx is loaded on the sample stage 5.

The original plate stage 2X is provided on the lower side (on the side of the wafer Wx) of the stage base 9. The original plate stage 2X fixes the template 15 at a certain position from the rear surface side (the surface on which no template pattern is formed) of the template 15, using, for example, vacuum suction.

The stage base 9 supports the template 15 using the original plate stage 2X and presses the template pattern of the template 15 against the resist 40X on the wafer Wx. The stage base 9 is moved in the up-down direction (vertical direction) to press the temple against the resist 40X or to separate (demold) the template 15 from the resist 40X.

The resist 40X which is an imprinting material is, for example, a resin (photo-curable agent) having photo-curable characteristics. For example, a low-k (low-permittivity) film or organic material is used as the resist 40X.

The alignment sensor 7 is provided above the stage base 9. The alignment sensor 7 is a sensor which detects the position of the wafer Wx or the position of the template 15.

The light source 10 is a light source which emits light, such as UV light, and is provided above the stage base 9. The light source 10 emits UV light to the transparent template 15, with the template 15 being pressed against the resist 40X.

The control device 30 is, for example, a computer which is connected to each component of the imprinting apparatus 101A and controls each component. In FIG. 1, the control device 30 is connected to toe dropping device 40 and the connection of the control device 30 to other components of the imprinting apparatus 101A is not illustrated in FIG. 1.

The control device 30 selects a drop recipe corresponding to the topography of the wafer Wx from the drop recipe information generated by a drop recipe generation device 20X. The control device 30 transmits an instruction corresponding to the selected drop recipe to the dropping device 40 to control the dropping device 40. The dropping device 40 drops the resist 40X to the position corresponding to an instruction from the control device 30. In this way, the imprinting apparatus 101A drops the resist 40X to the position corresponding to the topography Tx of the wafer Wx.

The topography measurement device measures topography of the wafer. The topography measured by the topography measurement device 35 includes information, such as the flatness of the topography or the shape of the topography.

When drop recipe information is generated, the topography measurement device 35 measures the topographies Ty of various wafers Wy and transmits the measurement results to the drop recipe generation device 20K. When drop recipe information is generated, the topography measurement device 35 extracts the wafers Wy one by one from, for example, various lots and measures the topography Ty of each of the extracted wafers Wy. In addition, the topography measurement device 35 measures the topography Tx of the wafer Wx to be imprinted with a pattern and transmits measurement results to the control device 30.

The drop recipe generation device 20K is, for example, a computer which generates a drop recipe corresponding to each topography Ty on the basis of various topographies Ty of various wafers Wy. For example, the drop recipe generation device 20K generates a drop recipe corresponding to an M-th (M is a natural number) topography on the basis of the M-th topography (the topography of an M-th shot) of an M-th wafer Wy.

The drop recipe generation device 20K generates the drop recipe such that the resist 40K is arranged at a liquid droplet density corresponding to the depths (topographies Tx and Ty) of the step portions in the wafer by. Specifically, the drop recipe generation device 20K generates the drop recipe such that liquid droplets of the resist 40K are arranged at a higher arrangement density in a region with a deeper step portion in the imprinting shot. In addition, the drop recipe generation device 20K generates a plurality of drop recipes for one topography. The drop recipe generation device 20K associates the generated drop recipe with the topography Ty and transmits information in which the generated drop recipe is associated with the topography Ty as the drop recipe information to the control device 30.

When imprinting is performed on the wafer Wx, the wafer Wx is moved to a position immediately below the dropping device 40. Then, the dropping device 40 drops the resist 40X to the position corresponding to the instruction from the control device 30. In addition, the wafer Wx having the resist 40X dropped thereon is moved to a position immediately below the template 15. Then, the template 15 is pressed against the resist 40X on the wafer Wx.

The imprinting apparatus 101A may press the resist 40K against the template 15, instead of pressing the template 15 against the resist 40X. In this case, the sample stage 5 presses the resist 40X on the wafer Wx against the template 15. As such, when the imprinting apparatus 101A presses the template pattern against the resist 40X, the distance between the template 15 and the wafer Wx having the resist 40X arranged thereon is close to a certain distance. In this way, the template pattern comes into contact with the resist 40X.

Next, the procedure of an imprinting process will be described. FIGS. 2A to 2D are diagrams illustrating the procedure of the imprinting process. FIGS. 2A to 2D are cross-sectional views illustrating, for example, the wafer Wx or the template 15 in the imprinting process.

Figure 2A:
FIGS. 2A to 2D are diagrams illustrating the procedure of an imprinting process.
Figure 2B:
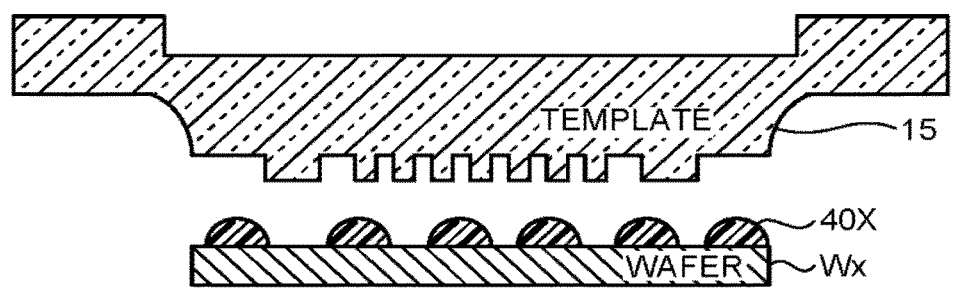
Figure 2C:
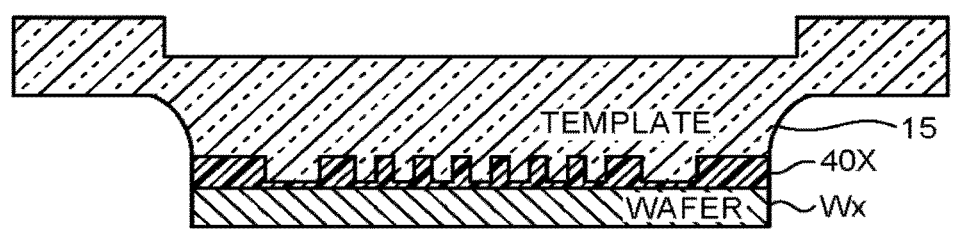

As illustrated in FIG. 2A, the resist 40X is dropped onto the upper surface of the wafer Wx by an ink-jet method. After the resist 40X is dropped, the template 15 is moved to the resist 40X as illustrated in FIG. 2B. Then, as illustrated in FIG. 2C, the template 15 is pressed against the resist 40X. When the template 15 manufactured by carving a pattern on, for example, a quartz substrate comes into contact with the resist 40X, the resist 40X flows into the template pattern of the template 15 by a capillary phenomenon.

The contact between the template 15 and the resist 40X is maintained for a certain period of time. Then, the template pattern is filled with the resist 40X. In this state, when the UV light from the light source 10 is radiated to the resist 40X through the template 15, the resist 40K is hardened.

Figure 2D:

Then, as illustrated in FIG. 2D, the template 15 is separated from the hardened resist (resist pattern 40Y) and the resist pattern 40Y, which is a reverse pattern of the template pattern, is formed on the wafer Wx. After the imprinting process is performed on a first shot of the wafer Wx, the imprinting apparatus 101A performs the imprinting process on a second shot of the wafer Wx.

Figure 3:
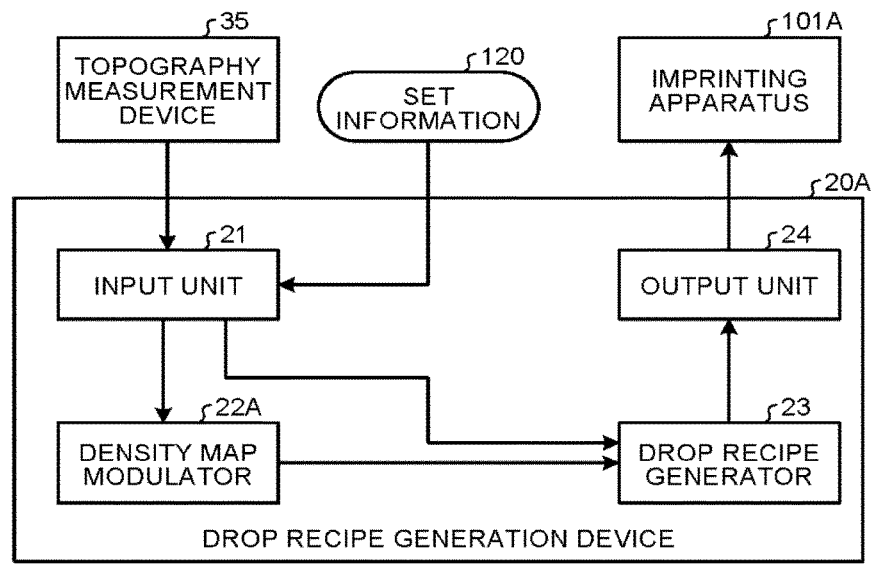
FIG. 3 is a diagram illustrating the structure of a drop recipe generation device according to the first embodiment.

FIG. 3 is a diagram illustrating the structure of the drop recipe generation device according to the first embodiment. A drop recipe generation device 20A is an example of the drop recipe generation device 20X. The drop recipe generation device 20A is connected to the topography measurement device 35 and the imprinting apparatus 101A. The drop recipe generation device 20A includes an input unit 21, a density map modulator (density map modulation unit) 22A, a drop recipe generator (drop recipe generation unit) 23, and an output unit 24.

A plurality of topographies Ty measured by the topography measurement device 35 are input to the input unit 21. In addition, set information 120 is input to the input unit 21. The set information 120 is used to generate a drop recipe. The set information 120 is, for example, a resist layer thickness (RLT), shot edge exclusion (a region except for a shot edge), or pattern density information. The pattern density information is information indicating a pattern density distribution in a shot and is, for example, design data (pattern layout). For example, the RLT and the pattern density information are common to all shots. The input unit 21 transmits the input topographies Ty to the density map modulator 22A. In addition, the input unit 21 transmits the input set information 120 to the drop recipe generator 23.

The density map modulator 22A creates a density map for each shot, using a density map creation program. In this embodiment, the density map is created for each shot. The density map is information corresponding to a step portion of the topography Ty. The density map indicates the arrangement density of the resist 40X corresponding to the topography Ty. In the density map, a region having a deeper step portion has a higher arrangement density in an imprinting shot.

The density map modulator 22A creates a density map, which is an image format, from the topographies. Specifically, the density map modulator 22A creates a density map corresponding to the topography for each topography. In this way, a density map is created for each shot. The density map modulator 22A associates the created density map with the topography for each shot. In other words, the density map corresponding to one shot is associated with the topography corresponding to one shot. The density map modulator 22A transmits the associated information to the drop recipe generator 23.

The drop recipe generator 23 creates drop recipe information, using the density map and the set information 120. Specifically, the drop recipe generator 23 generates a drop recipe corresponding to the density map and the set information 120 for each shot. In this way, a plurality of drop recipes are generated.

The drop recipe generator 23 generates the drop recipe such that the liquid droplets of the resist 40X are arranged at a higher arrangement density in a region having a deeper step portion in an imprinting shot. In addition, the drop recipe generator 23 generates the drop recipe such that the liquid droplets of the resist 40X are arranged at a higher arrangement density in a region having a higher pattern density (a region having a larger concave pattern area) in an imprinting shot.

The drop recipe generator 23 creates the drop recipe information in which the topography Ty corresponding to the density map is associated with the generated drop recipe. The drop recipe generator 23 creates the drop recipe information for each shot. In other words, the topography corresponding to one shot is associated with the drop recipe corresponding to one shot. Therefore, the drop recipe information includes information corresponding to a plurality of shots in which the topography Ty is associated with the drop recipe. The drop recipe generator 23 transmits the information associated with each shot as the drop recipe information to the output unit 24. The output unit 24 transmits the drop recipe information to the imprinting apparatus 101A. Then, the control device 30 of the imprinting apparatus 101A installs the drop recipe information.

Figure 4:
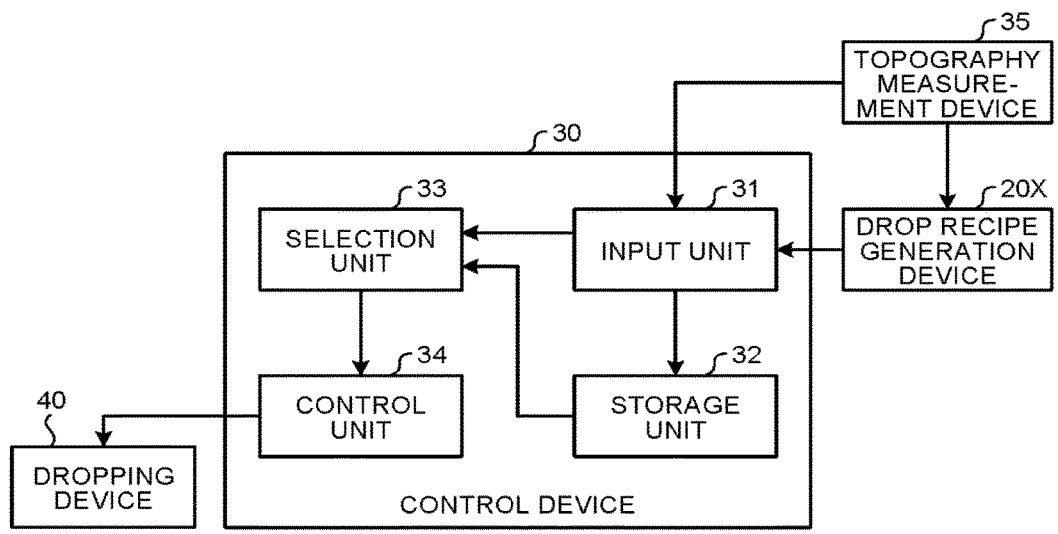
FIG. 4 is a diagram illustrating the structure of a control device according to the first embodiment.

FIG. 4 is a diagram illustrating the structure of the control device according to the first embodiment. The control device 30 is connected to the dropping device 40, the topography measurement device 35, and the drop recipe generation device 20X. The control device 30 includes an input unit 31, a storage unit 32, a selection unit (selector) 33, and a control unit (controller) 34.

The drop recipe information is input from the drop recipe generation device 20K to the input unit 31. In addition, the topography Tx of the wafer Wx to be imprinted with a pattern is input from the topography measurement device 35 to the input unit 31. The topography measurement device 35 according to this embodiment measures the topography Tx of the wafer Wx and inputs the measured topography Tx to the input unit 31.

When the drop recipe information is input, the input unit 31 stores the drop recipe information in the storage unit 32. In addition, when the topography Tx is input, the input unit 31 transmits the topography Tx to the selection unit 33. The storage unit 32 is, for example, a memory which stores the drop recipe information.

The selection unit 33 selects a drop recipe corresponding to the topography Tx from the drop recipe information. Specifically, the selection unit 33 selects a topography that is closest to the topography Tx from the drop recipe information and selects a drop recipe corresponding to the selected topography. The selection unit 33 according to this embodiment selects a drop recipe for each shot of the wafer Wx. The selection unit transmits the selected drop recipe to the control unit 34.

The control unit 34 controls the dropping device 40, using the selected drop recipe information. The dropping device 40 drops the liquid droplets of the resist 40X to the position corresponding to the instruction from the control unit 34 in each shot of the wafer Wx. The control device 30 may be implemented by hardware (e.g., as a system-on-chip). Or the control device 30 may be implemented by software. Or the control device 30 may have part of its function implemented by hardware and the rest implemented by software.

Figure 5:
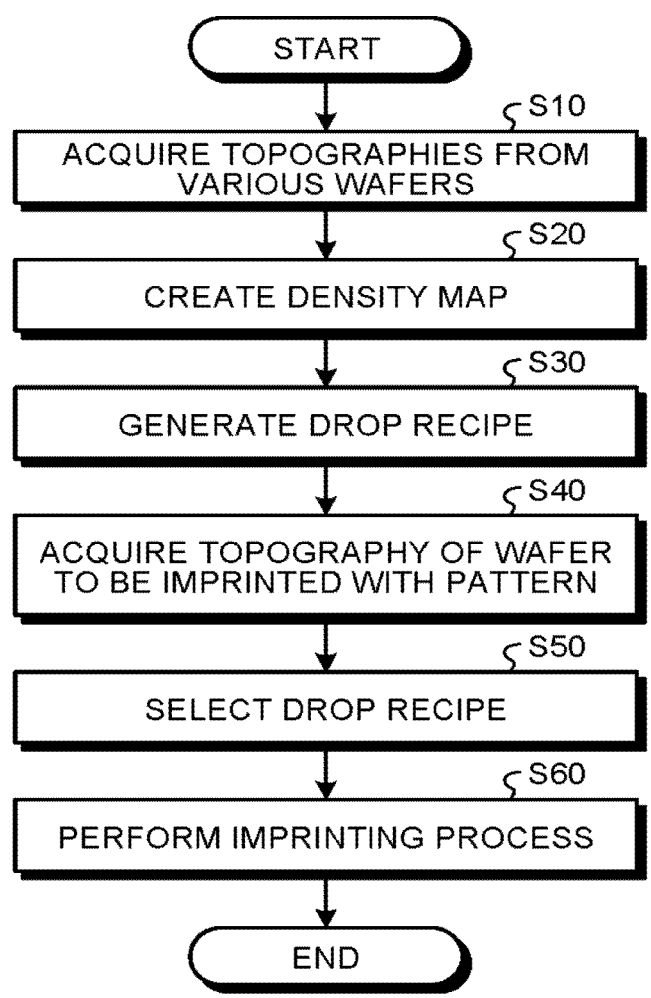
FIG. 5 is a flowchart illustrating the procedure of a drop recipe setting process according to the first embodiment.

Next, the procedure of a drop recipe setting process will be described. FIG. 5 is a flowchart illustrating the procedure of the drop recipe setting process according to the first embodiment. The topography measurement device 35 measures the topographies Ty of various wafers Wy. In this way, the topography measurement device 35 acquires the topographies Ty of various wafers Wy (Step S10). The topography measurement device 35 transmits the measured topographies Ty to the drop recipe generation device 20A.

The density map modulator 22A of the drop recipe generation device 20A creates a density map corresponding to the topography Ty for each topography Ty in each shot (Step S20). Then, the drop recipe generator 23 generates a drop recipe corresponding to the density map for each density map corresponding to each shot (Step S30). In addition, the drop recipe generator 23 creates drop recipe information in which the topography Ty corresponding to the density map is associated with the generated drop recipe. The output unit 24 transmits the drop recipe information to the control device 30. Then, the storage unit 32 of the control device 30 stores the drop recipe information.

The topography measurement device 35 measures the topography Tx of the wafer Wx to be imprinted with a pattern. In this way, the topography measurement device 35 acquires the topography Tx of the wafer Wx (Step S40). The process in Step S40 may be performed at any time. For example, the process in Step S40 may be performed before any of Steps S10 to S30 or may be performed at the same time as any of Steps S10 to S30. The topography measurement device 35 transmits the measured topography Tx to the control device 30.

The selection unit 33 of the control device 30 selects a topography that is closest to the topography Tx from the drop recipe information. Specifically, the selection unit 33 extracts one topography from the drop recipe information and compares the extracted topography with the topography Tx.

For example, tree selection unit 33 compares the PV value (difference in height) of the topography Tx with the PV value of the extracted topography and calculates the difference therebetween (hereinafter, referred to as a difference PV). The PV value is the maximum shape error, that is, the difference between the highest point (peak) and the lowest point (valley) in the measurement range.

In addition, for example, the selection unit 33 compares the shape of the topography Tx with the shape of the extracted topography and calculates the difference therebetween (hereinafter, referred to as a difference shape). The shape of the topography is the cross-sectional shape of the topography.

The selection unit 33 selects a topography, which has the minimum difference PV and the minimum difference shape with respect to the topography Tx in the drop recipe information, as the topography that is closest to the topography Tx from the drop recipe information.

The selection unit 33 may weight the difference PV and the difference shape to select the topography that is closest to the topography Tx from the drop recipe information. In addition, the selection unit 33 may select the topography that is closest to the topography Tx from the drop recipe information, on the basis of only the difference PV. Furthermore, the selection unit 33 may select the topography that is closest to the topography Tx from the drop recipe information, on the basis of only the difference shape. The selection unit 33 selects a drop recipe corresponding to the selected topography (Step S50).

The selection unit 33 according to this embodiment selects the drop recipe for each shot of the wafer Wx. The selection unit 33 transmits the selected drop recipe to the control unit 34. The control unit 34 controls an imprinting process, using the selected drop recipe (Step S60).

Specifically, the control unit 34 controls the dropping device 40, using the selected drop recipe. The dropping device 40 drops the liquid droplets of the resist 40X to the position corresponding to the instruction from the control unit 34. Then, the template 15 is pressed against the resist 40X.

In addition, UV light is emitted to the resist 40X through the template 15. After the resist 40X is hardened, the template 15 is separated from the resist pattern 40Y and the resist pattern 40Y is formed on the wafer Wx.

Figure 6:
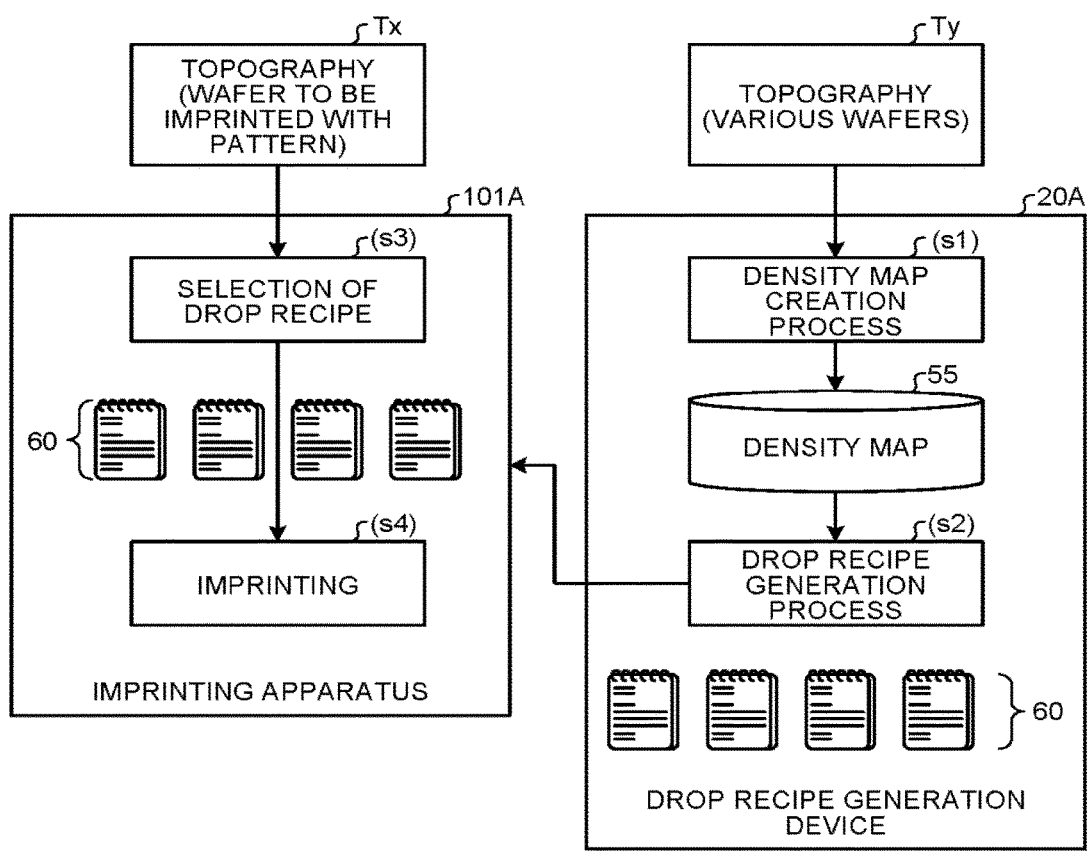
FIG. 6 is a diagram illustrating a drop recipe generation process and a drop recipe selection process according to the first embodiment.

FIG. 6 is a diagram illustrating a drop recipe generation process and a drop recipe selection process according to the first embodiment. The measured topographies Ty of various wafers Wy are input to the drop recipe generation device 20A. The density map modulator 22A of the drop recipe generation device 20A performs a process of creating a density map 55 corresponding to the topography Ty (s1).

Then, the drop recipe generator 3 performs the drop recipe generation process corresponding to the density map 55 (s2). In addition, the drop recipe generator 23 creates drop recipe information 60 in which the topography Ty and the drop recipe are associated with each other. Then, the drop recipe generation device 20A transmits the drop recipe information 60 to the imprinting apparatus 101A.

The measured topography Tx of the wafer Wx to be imprinted with a pattern is input to the imprinting apparatus 101A. The imprinting apparatus 101A selects a drop recipe corresponding to the topography Tx from the drop recipe information 60. In this case, the imprinting apparatus 101A selects a drop recipe for each shot. In other words, the imprinting apparatus 101A selects a drop recipe for each shot (s3). Then, the imprinting apparatus 101A performs an imprinting process, using the selected drop recipe (s4).

Figure 7:
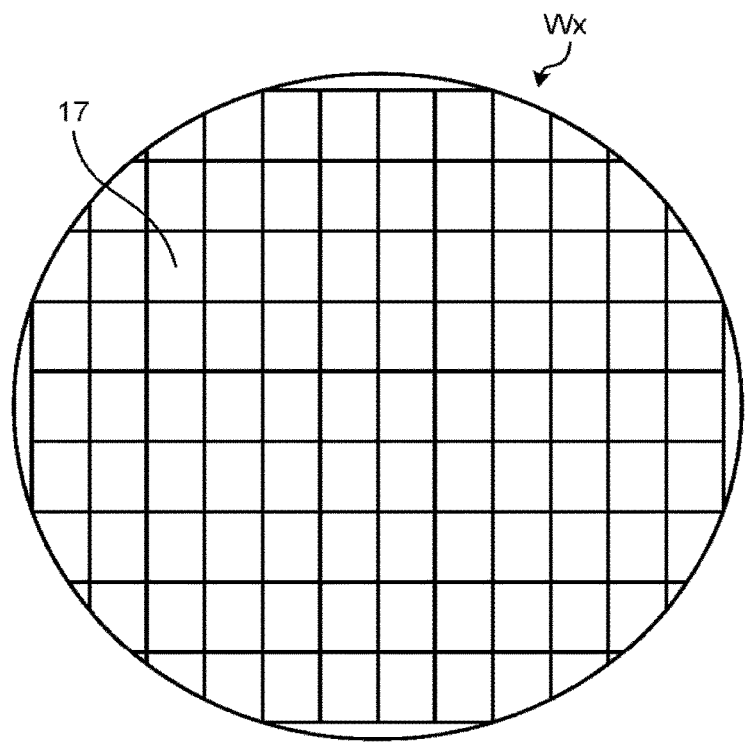
FIG. 7 is a diagram illustrating an imprinting shot set in a wafer.

Here, an imprinting shot will be described. FIG. 7 is a diagram illustrating imprinting shots which are set in the wafer. A plurality of rectangular imprinting shots 17 are arranged in the wafer Wx. In the wafer 81x, the imprinting process is performed for each imprinting shot 17.

Figure 8:
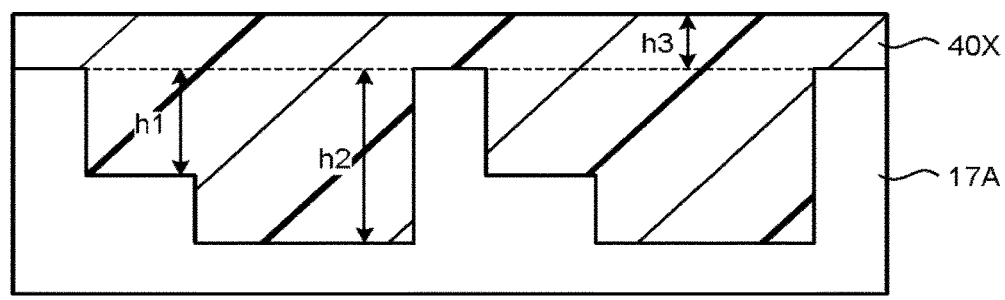
FIG. 8 is a diagram illustrating the cross-sectional shape of the imprinting shot.

Here, the topography Tx will be described. FIG. 8 is a diagram illustrating the cross-sectional shape of the imprinting shot. FIG. 8 is a cross-sectional view illustrating an imprinting shot 17A which is an example of the imprinting shot 17. FIG. 8 illustrates a state in which the imprinting shot 17A is filled up with the resist 40X.

The imprinting shot 17A in the wafer Wx has various step portions and the step portions form the topography Tx. For example, a groove with a depth h1 and a groove with a depth h2 are present in the imprinting shot 17A. These grooves form the step portion.

A resist film with a thickness h3 which remains between the wafer Wx and the template 15 is set on the imprinting shot 17A. The thickness h3 of the resist film is also called an RLT. The setting of the RLT makes it possible to prevent the template 15 from colliding with the wafer Wx when the template 15 is pressed against the resist 40X.

The RLT is set to, for example, a value which is common to the imprinting shots 17 of the wafer Wx. The imprinting shots 17 of the wafer Wx have different topographies. Therefore, the drop recipes suitable for the imprinting shots 17 are different from each other. In this embodiment, the drop recipe corresponding to the step portions with the depths h1 and h2 in each imprinting shot 17 is selected.

Therefore, it is possible to reduce shearing force applied to the template 15 and the wafer Wx.

Figure 9A:
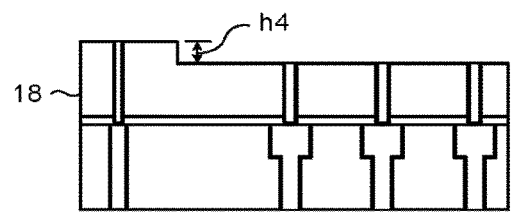
FIGS. 9A to 9D are diagrams illustrating an example of the arrangement of a resist.
Figure 9B:
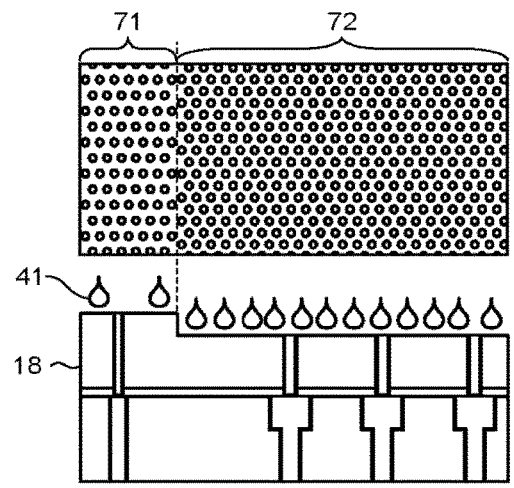
Figure 9C:
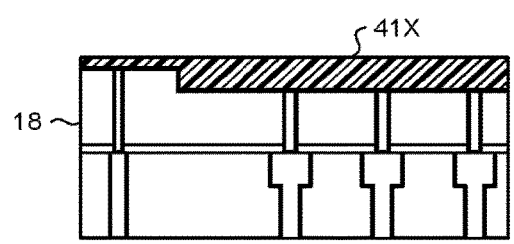

FIGS. 9A to 9D are diagrams illustrating an example of the arrangement of the resist. FIGS. 9A to 9D illustrate a shot 18 in which a pattern is formed. The shot 18 may be an imprinting shot, such as the imprinting shot 17, or other shots. FIGS. 9A, 9C, and 98 are cross-sectional views illustrating the shot 18 and FIG. 9B is a top view and a cross-sectional view illustrating the shot 18.

As illustrated in FIG. 9A, for example, in some cases, the shot 18 has a step portion with a depth h4. In this case, as illustrated in FIG. 9B, resist liquid droplets 41 are arranged on the basis of the topography of the shot 18 such that the density of the liquid droplets on the upper side (convex portion) of the step portion is lower than that on the lower side (concave portion) of the step portion. For example, when a region 71 is higher than a region 72 in the shot. 18, the resist liquid droplets 41 are arranged such that the density of the liquid droplets in the region 71 is lower than the density of the liquid droplets in the region 72. FIG. 9B schematically illustrates the arrangement position of the resist liquid droplets 41. In addition, FIG. 9B illustrates a case in which pattern density is uniform in the regions 71 and 72 for convenience of explanation.

Then, as illustrated in FIG. 9C, the resist liquid droplets 41 are spread in the shot 18. Then, the resist liquid droplets 41 become the flattened resist 41X. As such, when the resist liquid droplets 41 are arranged on the basis of the topography of the shot 18, it is possible to flatten the shot 18.

Figure 9D:
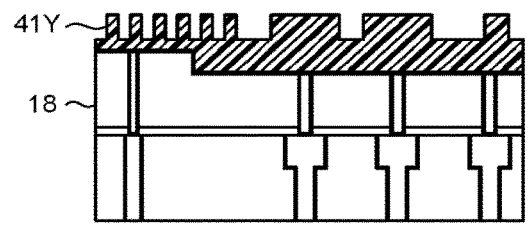

In the case of the imprinting process, the template 15 is pressed against the resist 41X and the resist 41X is hardened. Then, the template 15 is separated from the hardened resist (resist pattern 41Y). In this way, as illustrated in FIG. 9D, the resist pattern 41Y is formed on the shot 18. Similarly, each imprinting shot of the wafers Wx and Wy has the step portion in the shot illustrated in FIG. 9A.

However, during the imprinting process, an important factor which causes an overlay error is the topography of the wafer. The overlay error occurs because the shearing force applied to the template and the wafer increases during die-by-die alignment and the origin of the shearing force is the topography of the wafer. It is preferable to drop the resist on the wafer according to topography in order to reduce the shearing force. In this case, it is possible to ensure a flat surface on the wafer.

However, when the drop position of the resist to the topography is not appropriate, a difference in the thickness of the resist film between the template and the wafer in the shot occurs and shearing force is generated. Therefore, it is necessary to determine the drop recipe of the resist on the basis of an accurate topography.

In this embodiment, the drop recipe generation device 20A generates drop recipes corresponding to each topography Ty, on the basis of various topographies Ty of various wafers Wy. Then, the control device 30 selects a drop recipe for each shot of the wafer Wx. Therefore, the drop recipe of the resist 40X is determined on the basis of the accurate topography of the wafer Wx. As a result, it is possible to perform the imprinting process on the wafer Wx while reducing the influence of the topography Tx.

The imprinting apparatus 101A may include at least one of the drop recipe generation device 20X and the topography measurement device 35.

As such, in the first embodiment, the control unit 34 of the imprinting apparatus 101A controls the drop position of the resist to the wafer Wx, using the drop recipe corresponding to the topography Tx of the wafer Wx to be imprinted with a pattern.

As such, according to the first embodiment, since imprinting is performed using the drop recipe corresponding to the topography Tx, it is possible to reduce the shearing force applied to the template 15 and the wafer Wx. Therefore, it is possible to reduce the overlay error between the template 15 and the wafer Wx during the imprinting process. In addition, since imprinting is performed using the drop recipe corresponding to the topography Tx, the uniformity of the film thickness of the resist 40X is improved.

Second Embodiment

Next, a second embodiment will be described with reference to FIGS. 10 to 12. In the second embodiment, a density map and drop recipe information 60 are re-created on the basis of a difference in topography before and after a wafer Wx is imprinted with a pattern by the method described in the first embodiment.

Figure 10:
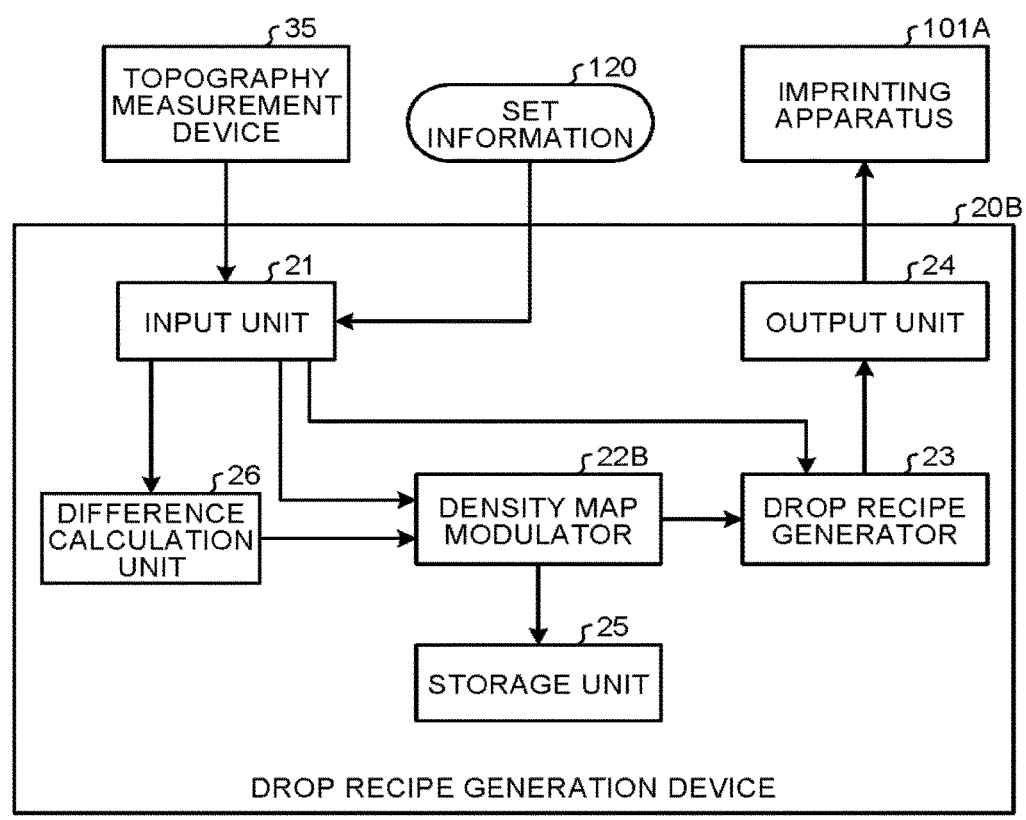
FIG. 10 is a diagram illustrating the structure of a drop recipe generation device according to a second embodiment.
Figure 11:
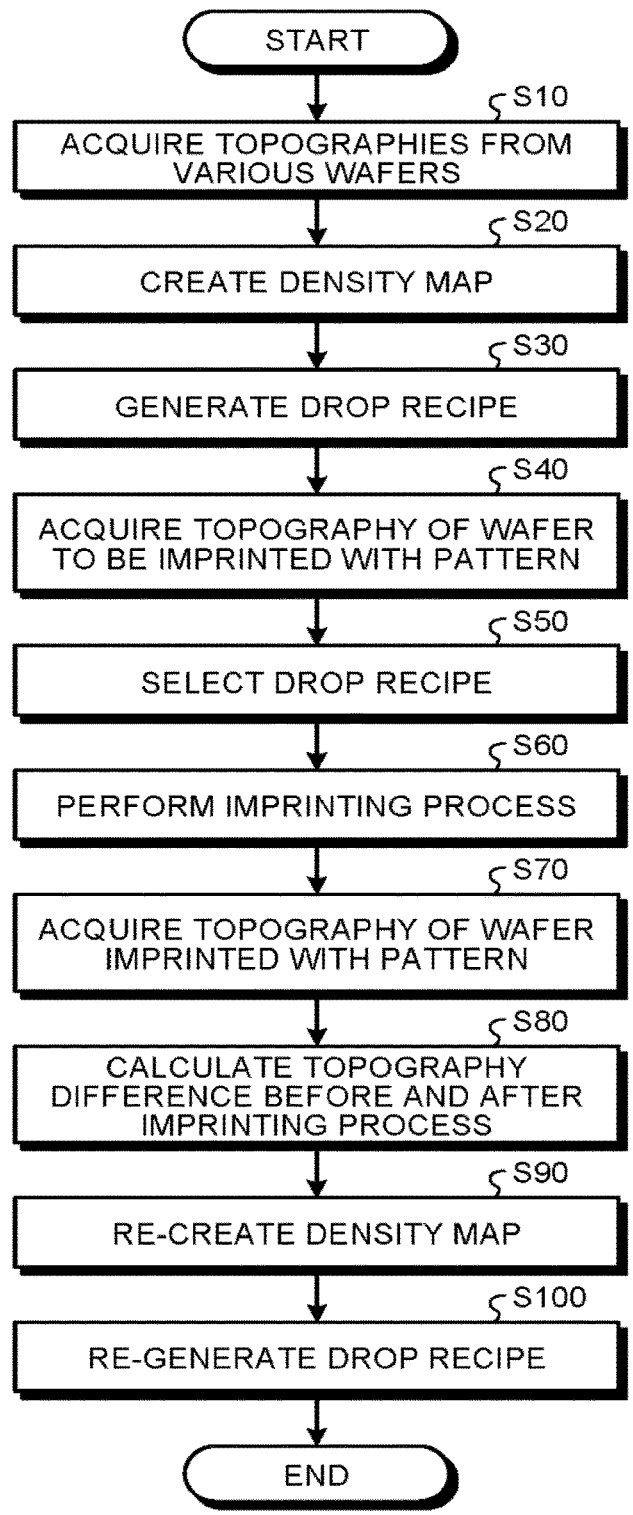
FIG. 11 is a flowchart illustrating the procedure of a drop recipe re-generation process.

FIG. 10 is a diagram illustrating the structure of a drop recipe generation device according to the second embodiment. Among the components illustrated in FIG. 10, components having the same function as those in the drop recipe generation device 20A according to the first embodiment illustrated in FIG. 3 are denoted by the same reference numerals and the redundant description thereof will not be repeated.

The topography measurement device 35 measures the topography Ty of a wafer Wy. In addition, the topography measurement device 35 measures the topography Tx of the wafer Wx before imprinting and the topography (hereinafter, referred to as a topography Tz) of the wafer Wx after imprinting. For example, the topography Tz is a step portion in a shot in a state in which a resist pattern 40Y is arranged. The topography Tz may be a step portion in a shot after the wafer Wx is etched from the upper side of the resist pattern 40Y. The topography measurement device 35 transmits the measured topographies Tx, Ty, and Tz to a drop recipe generation device 20B.

The drop recipe generation device 20B is an example of the drop recipe generation device 20K. The drop recipe generation device 20B is connected to the topography measurement device 35 and the imprinting apparatus 101A. The drop recipe generation device 20B includes an input unit 21, a density map modulator 222, a drop recipe generator 23, an output unit 24, a storage unit 25, and a difference calculation unit 26.

Set information 120 is input to the input unit 21. In addition, the topographies Tx, Ty, and Tz measured by the topography measurement device 35 are input to the input unit 21. When drop recipe information is created, the topography Ty is input to input unit 21. After the imprinting of a pattern on the wafer Wx is completed, the topographies Tx and is are input to the input unit 21.

The input unit 21 transmits the input set information 120 to the drop recipe generator 22. When drop recipe information is created, the input unit 21 transmits the topography Ty to the density map modulator 22B. After the imprinting of the pattern on the wafer Wx is completed, the input unit 21 transmits the topographies Tx and Tz to the difference calculation unit 26. The storage unit 25 is, for example, a memory which stores a density map corresponding to the topography Ty. The storage unit 25 stores information in which the topography Ty and the density map are associated with each other.

The difference calculation unit 26 calculates the difference (hereinafter, referred to as a topography difference Dxz) between the topography Tx before imprinting and the topography Tz after imprinting. In other words, the difference calculation unit 26 calculates the difference between the topographies (the amounts of topography error) before and after an imprinting process. The topography difference Dxz corresponds to a topography measurement error or a process error.

The difference calculation unit 26 compares the topography Tx and the topography Tz and calculates the topography difference Dxz. For example, the difference calculation unit 26 calculates the difference between a step portion at coordinates (x2, y2) in a shot having the topography Tx and a step portion at coordinates (x2, y2) in a shot having the topography Tz. The difference calculation unit 26 calculates the difference between a step portion in the topography Tx and a step portion in the topography Tz at various coordinates in a shot. The difference calculation unit 26 sets the distribution (map) of the calculated difference in the shot as the topography difference Dxz.

The density map modulator 22B creates a density map corresponding to the topography Ty for each topography Ty, similarly to the density map modulator 22A. The density map modulator 22B stores the created density map and the topography Ty in the storage unit 25 so as to be associated with each other.

In addition, the density map modulator 222 re-creates a density map corresponding to the topography Tx, on the basis of the topography difference Dxz.

Specifically, the density map modulator 222 re-creates a density map corresponding to the topography Ty used in the wafer Wx, on the basis of the topography difference Dxz between the topographies Tx and Tz. In addition, the density map corresponding to the topography Ty may be corrected on the basis of the topography difference Dxz. The density map modulator 22B stores the re-created or corrected density map and the topography Ty in the storage unit 25 so as to be associated with each other. In addition, the density map modulator 22B transmits the associated information to the drop recipe generator 23. The drop recipe generator 23 re-creates the drop recipe information 60, using the re-created density map.

Next, the procedure of a drop recipe setting process will be described. FIG. 11 is a flowchart illustrating the procedure of a drop recipe re-generation process. The process in Steps S10 to S60 is the same as that in the first embodiment and the description thereof will not be repeated.

In the second embodiment, similarly to the first embodiment, after a drop recipe is generated using the wafer Wy, the drop recipe of a resist to the wafer Wx is selected. The topography Tx of the wafer Wx used to select the drop recipe of the resist to the wafer Wx is stored as a topography before imprinting in the storage unit 25. After the drop recipe is selected, an imprinting process on the wafer Wx is performed using the selected drop recipe.

After the resist pattern 40Y is formed on the wafer Wx by the imprinting process (Step S60), the topography measurement device 35 measures the topography Tz of the wafer Wx. In this way, the topography Tz of the wafer Wx imprinted with the pattern is acquired (Step S70). The topography measurement device 35 transmits the measured topography Tx of the wafer Wx to the drop recipe generation device 20B.

The difference calculation unit 26 of the drop recipe generation device 20B calculates the topography difference Dxz which is the difference between the topography Tx before imprinting and the topography Tz after imprinting. In other words, the difference calculation unit 26 calculates the topography difference Dxz before and after the imprinting process (Step S80). The difference calculation unit 26 transmits the calculated topography difference Dxz to the density map modulator 22B.

The density map modulator 22B re-creates a density map corresponding to the topography Ty used in the wafer Wx, on the basis of the topography difference Dxz between the topographies Tx and Ts (Step S90). The drop recipe generator 23 re-generates a drop recipe corresponding to the density map for each density map in each shot (Step S100).

In addition, the drop recipe generator 23 re-creates the drop recipe information in which a topography corresponding to the density map is associated with the generated drop recipe. The output unit 24 transmits the re-created drop recipe information to the control device 30. Then, the storage unit 32 of the control device 30 stores the drop recipe information.

The density map modulator 22B according to this embodiment re-creates the density map such that the difference between the topography Tx and the topography Tz is reduced. In addition, the drop recipe generator 23 re-creates the drop recipe information such that the difference between the topography Tx and the topography Tz is reduced. Therefore, when the wafer Wx is imprinted with a pattern using the re-created drop recipe information, the difference between the topography Tx before imprinting and the topography Tz after the wafer Wx is imprinted with the pattern is reduced.

Figure 12:
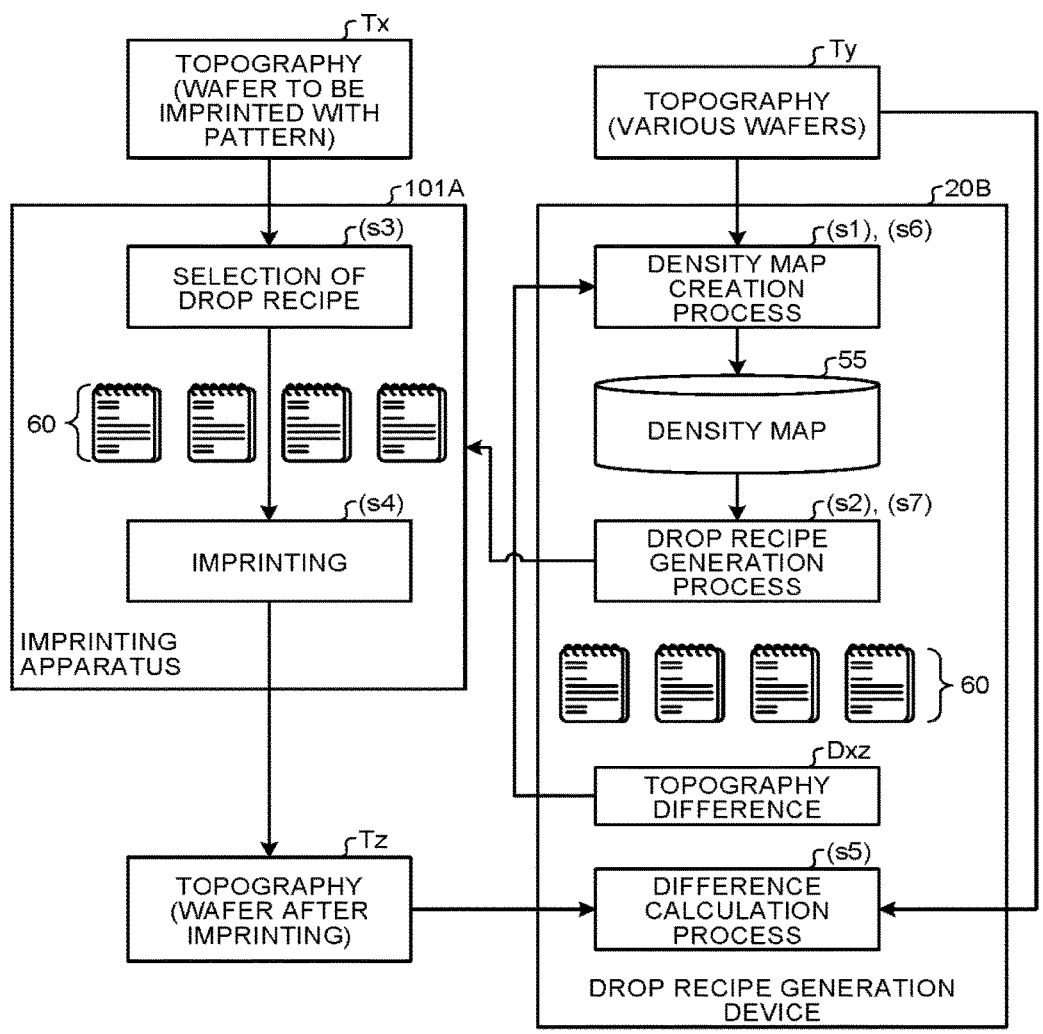
FIG. 12 is a diagram illustrating a drop recipe generation process and a drop recipe selection process according to the second embodiment.

FIG. 12 is a diagram illustrating a drop recipe generation process and a drop recipe selection process according to the second embodiment. The redundant description of the same processes as those in FIG. 6 among the processes illustrated in FIG. 12 will not be repeated.

The measured topographies Ty of various wafers Wy in various shots are input to the drop recipe generation device 20B. The density map modulator 22B of the drop recipe generation device 20B performs a process of creating a density map 55 corresponding to the topography Ty (s1). Then, the drop recipe generator 23 performs a process of generating a drop recipe corresponding to the density map (s2). In addition, the drop recipe generator 23 creates the drop recipe information 60 in which the topography Ty and the drop recipe are associated with each other. Then, the drop recipe generation device 20B transmits the drop recipe information 60 to the imprinting apparatus 101A.

The measured topography Tx of the wafer Wx to be imprinted with a pattern is input to the imprinting apparatus 101A. The imprinting apparatus 101A selects a drop recipe corresponding to the topography Tx from the drop recipe information 60. In this case, the imprinting apparatus 101A selects the drop recipe for each shot. In other words, the imprinting apparatus 101A selects the drop recipe for each shot 3). Then, the imprinting apparatus 101A performs an imprinting process using the selected drop recipe (s4).

After the imprinting process is performed, the topography Tz of the wafer Wx is measured. Then, the difference calculation unit 26 performs a process of calculating the topography difference Dxz on the basis of the topographies Tx and Tz (s5). The topography difference Dxz is transmitted to the density map modulator 22B.

The density map modulator 22B performs a process of creating (re-creating) the density map 55 corresponding to the topography Ty, using the topography difference Dxz and the topography Ty (s6). Then, the drop recipe generator 23 performs a process of generating (re-generating) the drop recipe corresponding to the density map 55 (s7). In addition, the drop recipe generator 23 re-creates the drop recipe information 60 in which the topography Ty and the drop recipe are associated with each other. Then, the drop recipe generation device 20B transmits the drop recipe information 6C to the imprinting apparatus 101A. Then, the imprinting apparatus 101A performs an imprinting process, using the re-created drop recipe information 60.

The difference calculation unit 26 may calculate the difference (hereinafter, referred to as a topography difference Dyz) between the topography Ty and the topography Tz, instead of the topography difference Dxz. In this case, the density map modulator 22B re-creates the density map corresponding to the topography Ty on the basis of the topography difference Dyz.

The density map modulator 22B may re-create the density map corresponding to the topography Tx on the basis of the topography difference Dxz or the topography difference Dyz. In this case, the drop recipe generator 23 re-creates the drop recipe information 60, using the density map corresponding to the topography Tx.

In this embodiment, the density map and the drop recipe information 60 are re-created on the basis of the topography difference before and after the imprinting process. However, the embodiment is not limited to the re-creation process and a general creation process may be performed. That is, the density map and the drop recipe information 60 may be created on the basis of the topography difference before and after the imprinting process.

As such, in the second embodiment, the density map and the drop recipe are re-created on the basis of the topography difference Dxz before and after the imprinting process. Therefore, it is possible to improve the reliability of the drop recipe information 60.

Third Embodiment

Next, a third embodiment will be described with reference to FIGS. 13 to 15. In the third embodiment, a density map is created for each wafer Wx and a drop recipe is generated from the created density map. Then, an imprinting process is performed using the generated drop recipe.

In this embodiment, since the drop recipe is generated by a drop recipe generation device 200 (not illustrated) having the same structure as the drop recipe generation device 20A described in the first embodiment, the description of the functional structure of the drop recipe generation device 200 will not be repeated. The drop recipe generation device 200 is an example of the drop recipe generation device 20X. As illustrated in FIG. 3, the drop recipe generation device 200 includes an input unit 21, a density map modulator 22A, a drop recipe generator 23, and an output unit 24.

Figure 13:
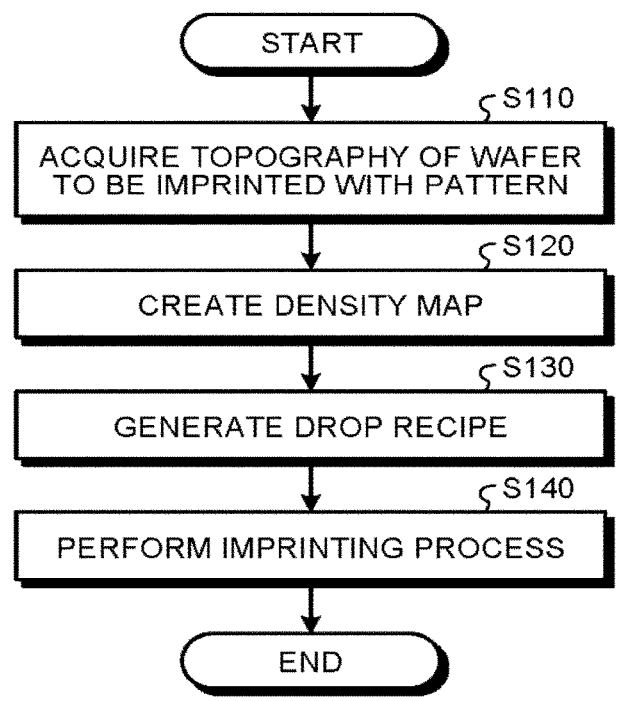
FIG. 13 is a flowchart illustrating the procedure of a drop recipe setting process according to a third embodiment.

FIG. 13 is a flowchart illustrating the procedure of a drop recipe setting process according to the third embodiment. The redundant description of the same processes as those in FIG. 5 among the processes illustrated in FIG. 13 will not be repeated.

The topography measurement device 35 measures the topography Tx of the wafer Wx to be imprinted with a pattern. In this way, the topography measurement device 35 acquires the topography Tx of the wafer Wx (Step S110). The topography measurement device 35 transmits the measured topography Tx of the wafer Wx to the drop recipe generation device 20C.

The density map modulator 22A of the drop recipe generation device 20C creates a density map corresponding to the topography Tx for each topography Tx in each shot (Step S120). Then, the drop recipe generator 23 generates a drop recipe corresponding to the density map for each density map in each shot (Step S130). The output unit 24 transmits the drop recipe as drop recipe information (drop recipe information 61 which will be described below) to the control device 30. The control unit 34 of the control device 30 controls an imprinting process using the drop recipe information 61 transmitted from the drop recipe generation device 20C (Step S140).

Figure 14:
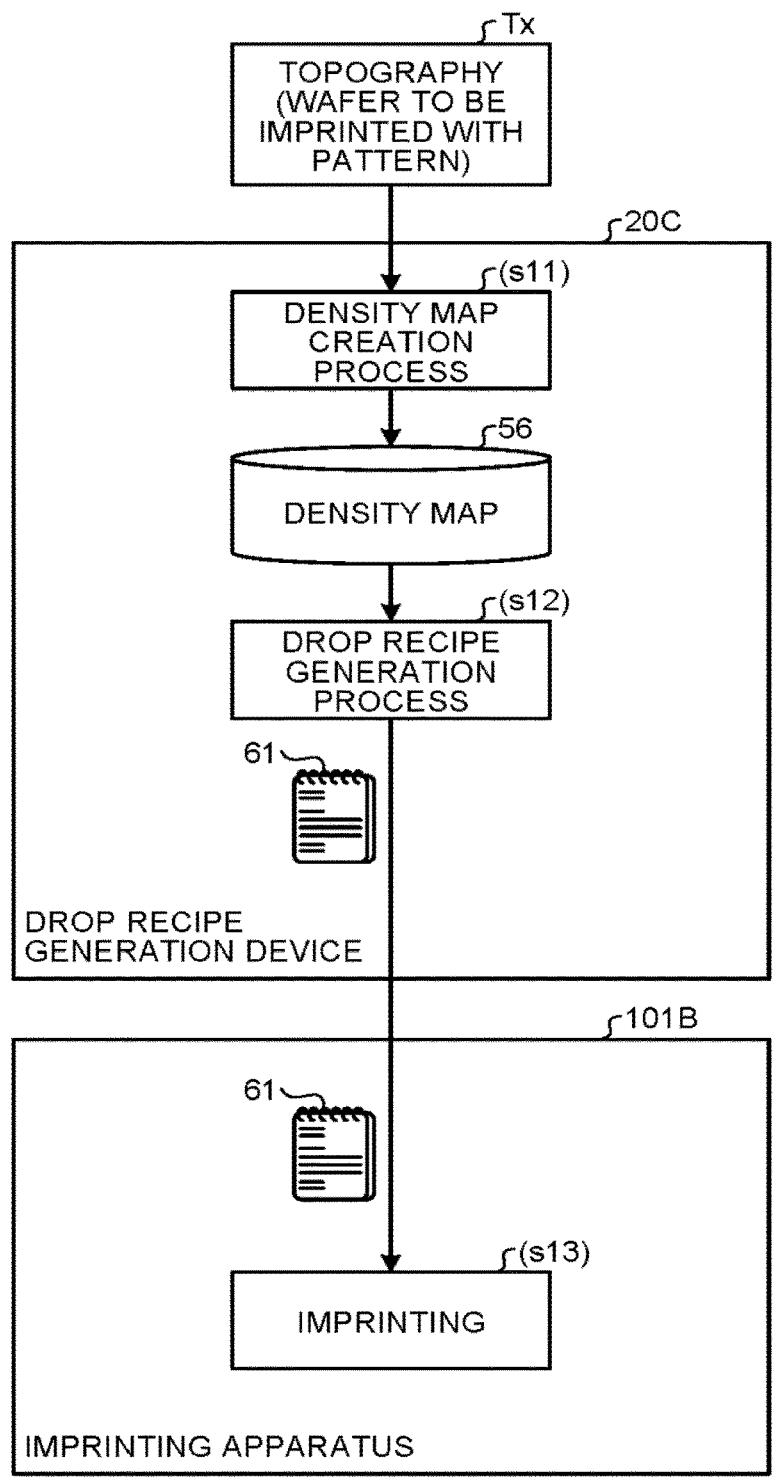
FIG. 14 is a diagram illustrating a drop recipe generation process and a drop recipe selection process according to the third embodiment.

FIG. 14 is a diagram illustrating a drop recipe generation process and a drop recipe selection process according to the third embodiment. The redundant description of the same processes as those in FIG. 6 among the processes illustrated in FIG. 14 will not be repeated.

The measured topography Tx of the wafer Wx to be imprinted with a pattern is input to the drop recipe generation device 20C. The density map modulator 22A of the drop recipe generation device 20C performs a process of creating a density map 56 corresponding to the topography Tx (511).

Then, the drop recipe generator 23 performs a process of generating a drop recipe corresponding to the density map 55 (s12). Then, the drop recipe generation device 20C transmits the drop recipe as drop recipe information 61 to an imprinting apparatus 101B. The imprinting apparatus 101B has the same structure as the imprinting apparatus 101A.

The drop recipe information 61 is input to the imprinting apparatus 101B. The imprinting apparatus 1015 performs an imprinting process using the drop recipe in the drop recipe information 61 (s13). The control device 30 according to this embodiment may not include the selection unit 33. In addition, the drop recipe information 61 may be created before imprinting or during imprinting.

The drop recipe generation device 20C may re-create the density map corresponding to the topography Tx on the basis of the topography difference Dxz before and after the imprinting process. In this case, after imprinting is performed on the wafer Nx using the drop recipe information 61, the topography Tz of the wafer after imprinting is measured. Then, the drop recipe generation device 20C re-creates the density map corresponding to the topography Ty used in the wafer Wx on the basis of the topography difference Dxz between the topographies Tx and Tz. In addition, the first to third embodiments may be combined with each other and an imprinting process may be performed.

For example, the process of creating the drop recipe information 61 described in the third embodiment is performed for each layer in the wafer process. Similarly, for example, the process of creating the drop recipe information 60 described in the first embodiment or the process of re-creating the drop recipe information 60 described in the second embodiment is performed for each layer in the wafer process.

The imprinting process is performed using the drop recipe information items 60 and 61 to manufacture a semiconductor device (semiconductor integrated circuit). Specifically, after the film to be processed is arranged on the wafer Wx, the resist 40X is arranged on the film to be processed. Then, the imprinting process is performed using the drop recipe information 60 or the drop recipe information 61. In this way, the resist pattern 40Y is formed on the wafer Wx. Then, the film to be processed which is provided below the resist pattern 40Y is etched using the resist pattern 40Y as a mask. In this way, the actual pattern corresponding to the resist pattern 40Y is formed on the wafer Wx. When a semiconductor device is manufactured, for example, the process of arranging the film to be processed, the process of creating the drop recipe information items 60 and 61, the imprinting process, and the etching process are repeatedly performed for each layer.

Next, the hardware configuration of the drop recipe generation devices 20A to 20C will be described. Since the drop recipe generation devices 20A to 20C have the same hardware configuration, only the hardware configuration of the drop recipe generation device 20A will be described here.

Figure 15:
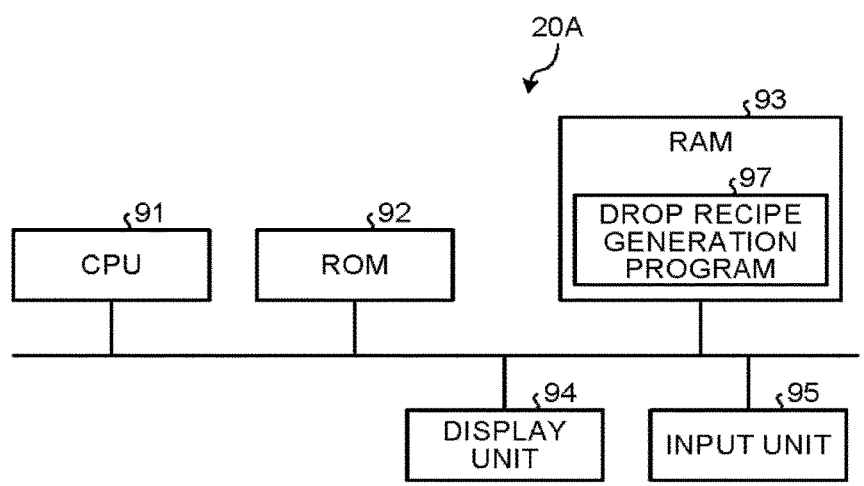
FIG. 15 is a diagram illustrating the hardware configuration of the drop recipe generation device.

FIG. 15 is a diagram illustrating the hardware configuration of the drop recipe generation device. The drop recipe generation device 20A includes a central processing unit (CPU) 91, a read only memory (ROM) 92, a random access memory (RAM) 93, a display unit 94, and an input unit 95. In the drop recipe generation device 20A, the CPU 91, the ROM 92, the RAM 93, the display unit 94, and the input unit 95 are connected to each other through a bus line.

The CPU 91 calculates a drop recipe using a drop recipe generation program 97 which is a computer program. The drop recipe generation program 97 is a computer program product which can be executed by a computer and has a non-transitory computer readable recording medium including a plurality of commands for calculating the drop recipe. The plurality of commands in the drop recipe generation program 97 cause a computer to calculate the drop recipe.

The display unit 94 is a display device, such as a liquid crystal monitor, and displays, for example, the topography Ty, the density map, the drop recipe, and the drop recipe information in response to an instruction from the CPU 91. The input unit 95 includes a mouse or a keyboard and receives instruction information (for example, parameters required to calculate the drop recipe) which is input by the user from the outside. The instruction information input to the input unit 95 is transmitted to the CPU 91.

The drop recipe generation program 97 is stored in the ROM 92 and is loaded to the RAM 93 through the bus line. FIG. 15 illustrates a state in which the drop recipe generation program 97 is loaded to the RAM 93.

The CPU 91 executes the drop recipe generation program 97 loaded to the RAM 93. Specifically, in the drop recipe generation device 20A, the CPU 91 reads the drop recipe generation program 97 from the ROM 92, develops the drop recipe generation program 97 in a program storage area of the RAM 93, and performs various processes, in response to the instruction which is input by the user through the input unit 95. The CPU 91 temporarily stores various kinds of data which are generated during various processes in a data storage area formed in the RAM 93.

The drop recipe generation program 97 executed by the drop recipe generation device 20A has a module configuration including the density map modulator 22A and the drop recipe generator 23. These modules are loaded to a main storage device and then generated on the main storage device.

As such, according to the third embodiment, the drop recipe corresponding to the topography Tx is generated for each wafer Wx. Therefore, it is possible to easily create the drop recipe information 61.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprinting apparatus, comprising:
a measurement device that measures a plurality of topographies respectively corresponding to a plurality of wafers;
an input device to which the plurality of topographies and set information are input;
a density map modulator that creates a plurality of density maps corresponding to the plurality of topographies;
a drop recipe generation device that creates a plurality of resist drop recipes corresponding to the plurality of topographies on the basis of the plurality of density maps and the set information;
a storage device that stores the plurality of topographies and the plurality of resist drop recipes;
a selector that compares a first topography of a first wafer measured by the measurement device and the plurality of topographies, selects a second topography that is one of the plurality of topographies, and selects a resist drop recipe corresponding to the second topography as a first resist drop recipe;
a dropping device that drops a resist onto the first wafer on the basis of the first resist drop recipe; and
a controller that controls so as to drop the resist to the first wafer on the basis of the first resist drop recipe.

2. The imprinting apparatus according to claim 1, wherein the controller sets the first resist drop recipe per imprinting shot and controls the resist drop position on the first wafer per imprinting shot.

3. The imprinting apparatus according to claim 1, wherein the selector selects the first resist drop recipe per imprinting shot and the controller controls the resist drop position on the first wafer per imprinting shot.

4. The imprinting apparatus according to claim 1, wherein when a peak to valley of a topography is set to a PV value, the selector calculates a difference shape that is a difference between the first topography of the first wafer measured by the measurement device and the plurality of topographies, and a difference PV value that is a difference between a PV value of the first topography and the plurality of topographies, and selects the second topography where the difference PV value and the difference shape become a minimum from among the plurality of topographies, and selects a resist drop recipe corresponding to the second topography as a first resist drop recipe.

5. The imprinting apparatus according to claim 4, wherein the selector weights the difference PV and the difference shape.

6. The imprinting apparatus according to claim 1, wherein the measurement device measures a third topography of the first wafer after the resist is dropped,
the imprinting apparatus farther comprises a difference calculator that calculates a topography difference that is a difference between the first topography and the third topography, and
the density map modulator re-creates a first density map corresponding to the second topography on the basis of the topography difference.

7. The imprinting apparatus according to claim 1, wherein the measurement device measures a third topography of the first wafer after the resist is dropped, the imprinting apparatus further comprises a difference calculator that calculates a topography difference that is a difference between the first topography and the third topography, and the density map modulator corrects a first density map corresponding to the second topography on the basis of the topography difference.

8. The imprinting apparatus according to claim 6, wherein the drop recipe generation device re-creates the first resist drop recipe on the basis of the first density map corresponding to the re-created second topography.

9. The imprinting apparatus according to claim 7, wherein the drop recipe generation device re-creates the first resist drop recipe on the basis of the first density map corresponding to the corrected second topography.

\* \* \* \* \*